(12) United States Patent
Bayer et al.

(10) Patent No.: US 11,283,239 B2
(45) Date of Patent: Mar. 22, 2022

(54) VERTICAL-CAVITY SURFACE EMITTING LASER SUPPORT ASSEMBLY

(71) Applicant: Thermo Electron Scientific Instruments LLC, Madison, WI (US)

(72) Inventors: William A. Bayer, Middleton, WI (US); Nicolai B. Mortensen, Madison, WI (US); Michael R. Daun, Fitchburg, WI (US)

(73) Assignee: THERMO ELECTRON SCIENTIFIC INSTRUMENTS LLC, Madison, WI (US)

(*) Notice: Subject to any disclaimer, the term of this patent is extended or adjusted under 35 U.S.C. 154(b) by 115 days.

(21) Appl. No.: 16/598,688

(22) Filed: Oct. 10, 2019

(65) Prior Publication Data

US 2020/0119520 A1    Apr. 16, 2020

Related U.S. Application Data

(60) Provisional application No. 62/743,725, filed on Oct. 10, 2018.

(51) Int. Cl.
| | |
|---|---|
| *H01S 5/183* | (2006.01) |
| *H01S 5/026* | (2006.01) |
| *H01S 5/024* | (2006.01) |
| *H01S 5/02253* | (2021.01) |
| *H01S 5/02326* | (2021.01) |
| *G01K 7/22* | (2006.01) |

(52) U.S. Cl.
CPC ............ *H01S 5/183* (2013.01); *H01S 5/0261* (2013.01); *H01S 5/02253* (2021.01); *H01S 5/02326* (2021.01); *H01S 5/02415* (2013.01); *G01K 7/22* (2013.01)

(58) Field of Classification Search
CPC ...... H01S 5/0261; H01S 5/02253; H01S 3/04; G01K 7/26; H01J 5/00; H01L 33/00
USPC ................................ 372/50.124, 35; 385/94
See application file for complete search history.

(56) References Cited

U.S. PATENT DOCUMENTS

| | | | |
|---|---|---|---|
| 6,654,125 B2 | 11/2003 | Maynard et al. | |
| 7,200,294 B2* | 4/2007 | Uchida ................ | G02B 6/4266 385/14 |
| 2005/0073690 A1 | 4/2005 | Abbink et al. | |
| 2006/0022213 A1 | 2/2006 | Posamentier | |

OTHER PUBLICATIONS

Berger P.R, et al., "Monolithically Peltier-Cooled Vertical-Cavity Surface-Emitting Lasers", Applied Physics Letters, vol. 59, No. 1, Jul. 1, 1991, pp. 117-119.
Lott J.A, el al., "Electrically Injected Visible (639-661 nm) Vertical Cavity Surface Emitting Lasers", Electronics Letters, vol. 29, No. 10, May 13, 1993, pp. 830-832.
PCT/US2019/055636, Search Report and Written Opinion, dated Jan. 9, 2020.

* cited by examiner

*Primary Examiner* — Tuan N Nguyen (57) ABSTRACT

A laser mount assembly includes a lens holder including a collimating lens. A laser subassembly is positioned adjacent the lens holder and includes a vertical-cavity surface-emitting laser, a thermal electric cooler, and a thermistor. A printed circuit board is positioned adjacent the laser subassembly and includes a plurality of heating components. The heating components heat the area between the lens holder and the laser subassembly.

20 Claims, 7 Drawing Sheets

VERTICAL-CAVITY SURFACE EMITTING LASER SUPPORT ASSEMBLY

CROSS-REFERENCE TO RELATED APPLICATIONS

The present application claims the priority benefit from U.S. Patent Application Ser. No. 62/743,725, filed Oct. 10, 2018, which is hereby incorporated by reference herein in its entirety for all purposes.

FIELD

Aspects of this disclosure relate generally to a support assembly for a laser, and more particularly, to a support assembly for a vertical-cavity surface emitting laser (VCSEL) for use in a Fourier transform infrared spectrometer.

BACKGROUND

Fourier transform infrared (FTIR) interferometric spectrometers are widely used in the analysis of chemical compounds. By measuring the absorption of infrared radiation by an unknown sample at various wave lengths in the infrared spectrum and comparing the results with known standards, these instruments generate useful information with respect to the chemical makeup of the unknown sample. In a typical FTIR spectrometer, infrared radiation from an infrared emitting source is collected, passed through an interferometer, passed through the sample to be analyzed, and brought to focus on an infrared detector. The interferometer system, in combination with the sample, modulates the intensity of the infrared radiation that impinges on the detector, and thereby forms a time variant intensity signal. It is the function of the detector to convert this time variant intensity signal to a corresponding time varying current. The current, in turn, is converted to a time varying voltage, which is presented to an analog-to-digital converter and then stored as a sequence of digital numbers to be processed in a processor associated with the spectrometer.

FTIR spectrometers can use different types of lasers to provide an energy source that sets a wavelength (or wavenumber) calibration of the interferometer. This reference laser beam is sent through the interferometer on a path that is parallel to the IR source beam. Historically, helium neon (HeNe) lasers have often been used since they provide a laser signal with a very narrow spectrum, providing wavelength stability. With respect to FTIR spectrometers, an HeNe laser can be considered to provide a laser wavelength that is constant over a wide range of operating temperatures.

In considering the use of a low cost VCSEL, one has to consider the sensitivity to such lasers to current and temperature variations. In order to effectively use a VCSEL, therefore, the temperature and current need to be effectively controlled.

There is a direct relationship between wavelength shift and temperature change. A VCSEL has a temperature coefficient that translates into peak-shifts in the FTIR spectrum. If for any reason, the temperature of the laser die of the VCSEL changes, it results in a change in wavelength. If the wavelength of the VCSEL drifts enough, the measured IR spectrum will be out of the wavelength accuracy specification.

A change in laser current has two effects on the laser itself: (1) intensity is proportional to current ("Slope Efficiency"), and (2) the wavelength changes with current by a small amount. Therefore, a change in laser current will cause a shift in the FTIR spectrum.

It would be desirable to provide a support assembly for a vertical-cavity surface emitting laser for an FTIR spectrometer that reduces or overcomes some or all of the difficulties inherent in prior known devices. Particular objects and advantages will be apparent to those skilled in the art, that is, those who are knowledgeable or experienced in this field of technology, in view of the following disclosure and detailed description of certain embodiments.

SUMMARY

In accordance with a first aspect, a laser mount assembly includes a lens holder including a collimating lens. A laser subassembly is positioned adjacent the lens holder and includes a vertical-cavity surface-emitting laser, a thermal electric cooler, and a thermistor. A printed circuit board is positioned adjacent the laser subassembly and includes a plurality of heating components. The heating components heat the area between the lens holder and the laser subassembly.

In accordance with another aspect, a method of heating a laser mount assembly includes providing a laser mount assembly including a lens holder including a collimating lens, a laser subassembly positioned adjacent the lens holder and including a vertical-cavity surface-emitting laser, a thermal electric cooler, and a thermistor, and a printed circuit board positioned adjacent the laser subassembly and including a plurality of heating components; heating the area between the lens holder and the laser subassembly to above a setpoint for the thermal electric cooler; and cooling the vertical-cavity surface-emitting laser to the desired setpoint using the thermal electric cooler and the thermistor.

These and additional features and advantages disclosed here will be further understood from the following detailed disclosure of certain embodiments, the drawings thereof, and from the claims.

BRIEF DESCRIPTION OF THE DRAWINGS

The foregoing and other features and advantages of the present embodiments will be more fully understood from the following detailed description of illustrative embodiments taken in conjunction with the accompanying drawings in which.

The figures referred to above are not drawn necessarily to scale, should be understood to provide a representation of particular embodiments, and are merely conceptual in nature and illustrative of the principles involved. Some features of the support assembly for a vertical-cavity surface emitting laser depicted in the drawings have been enlarged or distorted relative to others to facilitate explanation and understanding. The same reference numbers are used in the drawings for similar or identical components and features shown in various alternative embodiments. Support assemblies for a vertical-cavity surface emitting laser as disclosed herein would have configurations and components determined, in part, by the intended application and environment in which they are used.

DETAILED DESCRIPTION OF EMBODIMENTS

In the following description of various example structures in accordance with the disclosure, reference is made to the accompanying drawings, which form a part hereof, and in which are shown by way of illustration of various structures in accordance with the disclosure. Additionally, it is to be understood that other specific arrangements of parts and structures may be utilized, and structural and functional modifications may be made without departing from the scope of the present disclosure. Also, while spatial terms such as "top" and "bottom" and the like may be used in this specification to describe various example features and elements of the disclosure, these terms are used herein as a matter of convenience, e.g., based on the example orientations shown in the figures and/or the orientations in typical use. Nothing in this specification should be construed as requiring a specific three dimensional or spatial orientation of structures in order to fall within the scope of this disclosure.

Figure 1:
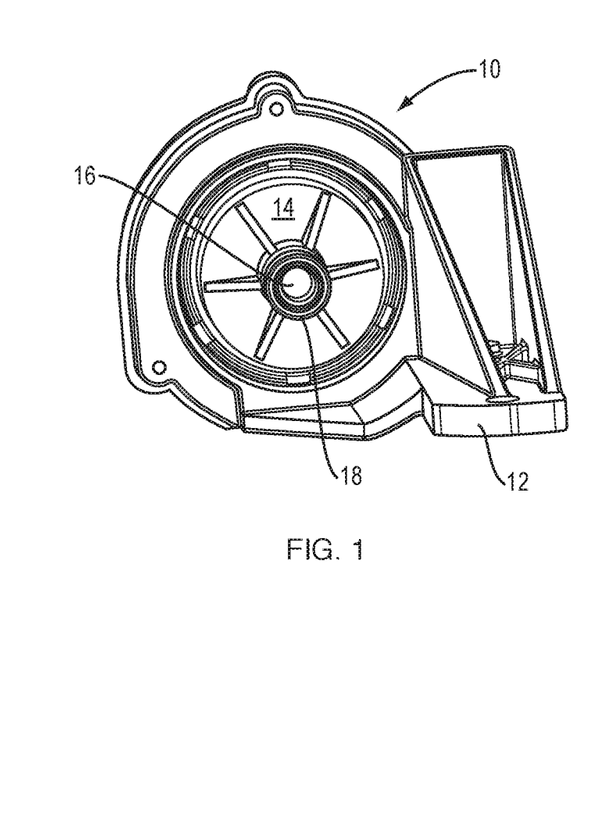
FIG. 1 is a perspective view of a support assembly for a laser.
Figure 2:
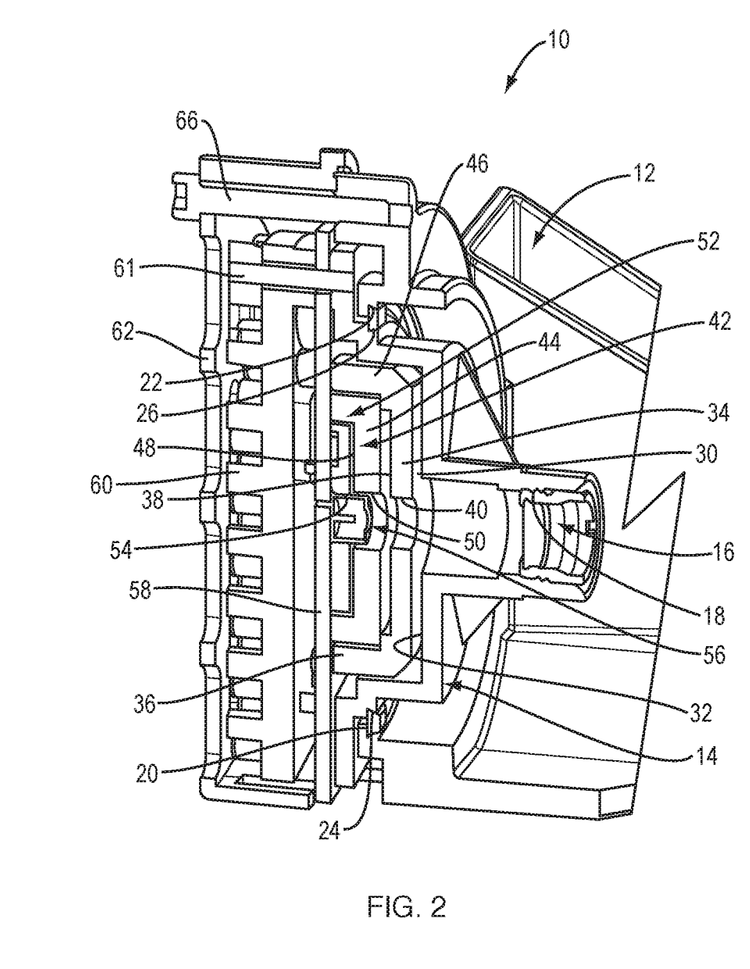
FIG. 2 is a section view, partially broken away, of the support assembly of FIG. 1.
Figure 3:
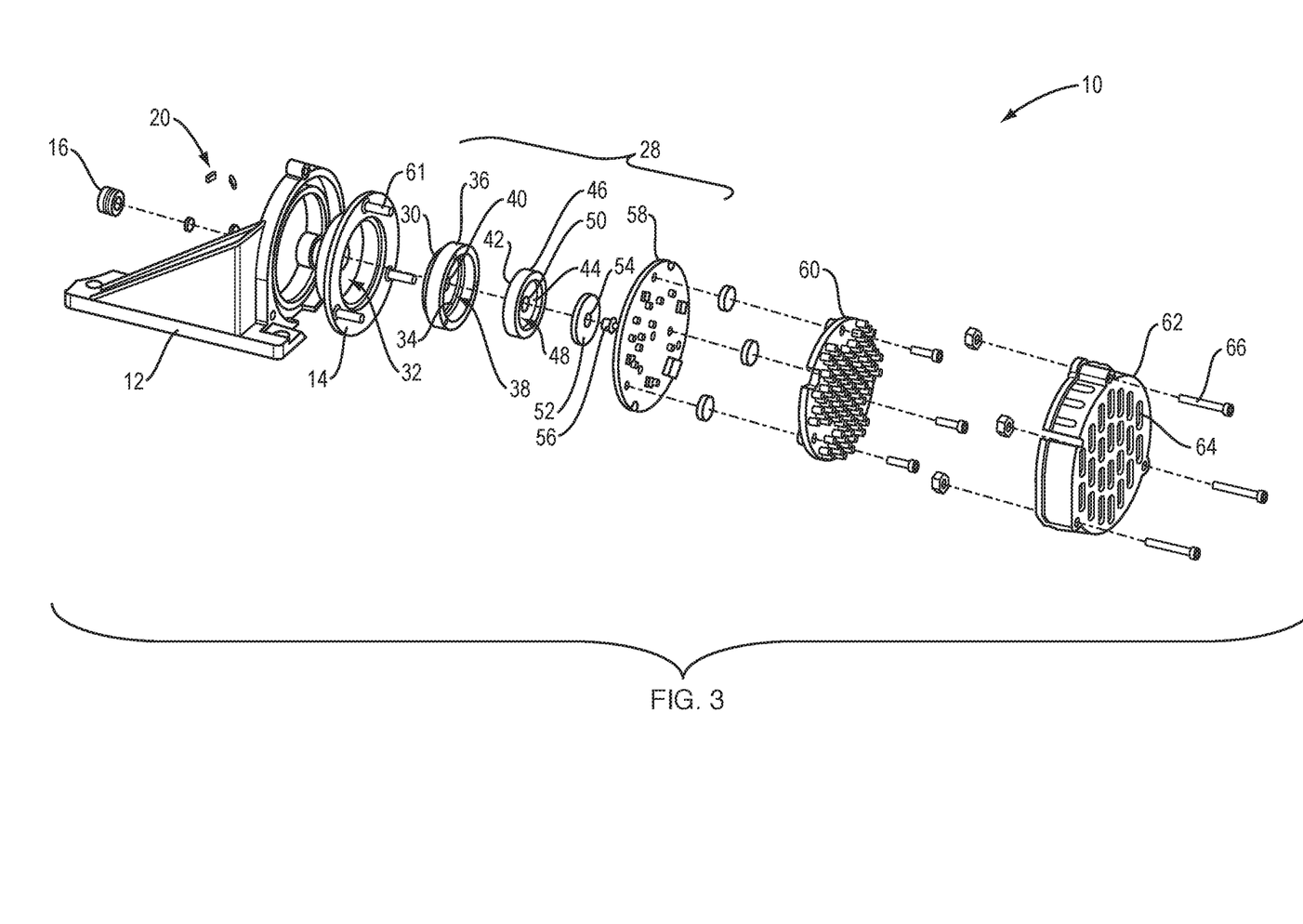
FIG. 3 is an exploded view of the support assembly of FIG. 1.

Referring to FIGS. 1-3, a laser assembly 10 is shown in perspective, section, and exploded views, respectively. Laser assembly 10 may include a laser assembly base 12 that is configured to be mounted to an FTIR spectrometer (not shown) by bolts, screws, or other secure fasteners. A lens holder 14 may be positioned adjacent and axially outward of laser assembly base 12, and may include a collimating lens 16. Collimating lens 16 may be threadingly received in a threaded aperture 18 formed in lens holder 14. The collimation provided by collimation lens 16 may change the scale ("yardstick") and affect the spectral resolution performance of the FTIR spectrometer.

A plurality of adhesive elements 20 may be positioned between laser assembly base 12 and lens holder 14 and serve to secure them to one another. Adhesive elements 20 may be captured within complimentary grooves formed in laser assembly base 12 and lens holder 14. In certain embodiments, a circular groove 22 with an undercut extending about an inner peripheral edge of laser assembly base 12 may cooperate with a circular groove 24 with an undercut that extends about an outer peripheral edge of lens holder 14 to define a channel 26 in which adhesive elements 20 may be positioned. Adhesive elements 20 are positioned within channel 26 and cured once the components of laser assembly 10 are in proper position.

In certain embodiments, adhesive elements 20 may be formed of acrylated urethane, such as Multi-Cure® 6-621 6-621, available from Dymax Corporation of Torrington, Conn.

A thermal assembly 28 is positioned adjacent and axially outward of lens holder 14. Thermal assembly 28 may include a thermal insulator 30 that is positioned adjacent and radially outward of lens holder 14. Thermal insulator 30 may be seated within a recess 32 formed in lens holder 14. Thermal insulator 30 may be formed with a circular base 34 and a wall 36 surrounding base 34 and defining a recess 38 therein. A through aperture 40 may be formed in a center of base 34 so as to allow laser light to pass through thermal insulator 30. Thermal insulator 30 may be formed of chlorinated polyvinyl chloride (CPVC), for example.

A thermal mass 42 of thermal assembly 28 may be positioned adjacent and axially outward of thermal insulator 30, and may be seated within recess 38 of thermal insulator 30. Thermal mass 42 may be formed with a circular base 44 and a wall 46 surrounding base 44 and defining a recess 48 therein. A through aperture 50 may be formed in a center of base 44 so as to allow laser light to pass through thermal mass 42. Thermal mass 42 may be formed of aluminum, copper, stainless steel, or other thermally conductive material.

A thermal heat transfer pad 52 of thermal assembly 28 may be positioned adjacent and radially outward of thermal mass 42, and may be seated in recess 48 of thermal mass 42. Thermal heat transfer pad 52 may be a circular plate with a through aperture 54 extending therethrough to allow laser light to pass though thermal heat transfer pad 52. Thermal heat transfer pad 52 may be formed of a silicone material with a fiberglass carrier, for example. An exemplary material for thermal heat transfer pad 52 is PS-1545 available from Polymer Science, Inc. of Monticello, Ind.

A VCSEL diode 56 of thermal assembly 28 may be positioned adjacent and radially outward of thermal heat transfer pad 52. A printed circuit board ("PCB") 58 of thermal assembly 28 may be positioned adjacent and axially outward of thermal insulator 30, thermal mass 42, and thermal heat transfer pad 52. VCSEL diode 56 may be operably mounted to PCB 58, and a portion of VCSEL diode 56 may be received in aperture 54 of thermal heat transfer pad 52, aperture 50 of thermal mass 42. In certain embodiments, PCB 58 has a circular shape.

A heat sink 60 may be positioned adjacent and axially outward of thermal assembly 28, and helps to dissipate heat generated by the thermal elements of PCB 58. Heat sink 60 may be formed of aluminum or aluminum alloys such as 6061 aluminum or A356 aluminum, or of copper.

Heat sink 60 may be directly secured to lens holder 14 by way of bolts 61, or other suitable fasteners, thereby creating a subassembly of lens holder 14, thermal assembly 28, and heat sink 60.

A cover 62 may be positioned adjacent and axially outward of heat sink 60, and may include a plurality of apertures 64. In certain embodiments, apertures 64 are in the form of slots. Cover 62 serves to protect laser assembly 10 and its components. Cover 62 may be constructed from various materials (e.g. plastic) and secured to laser assembly base by bolts 66, or other suitable fasteners.

Figure 4:
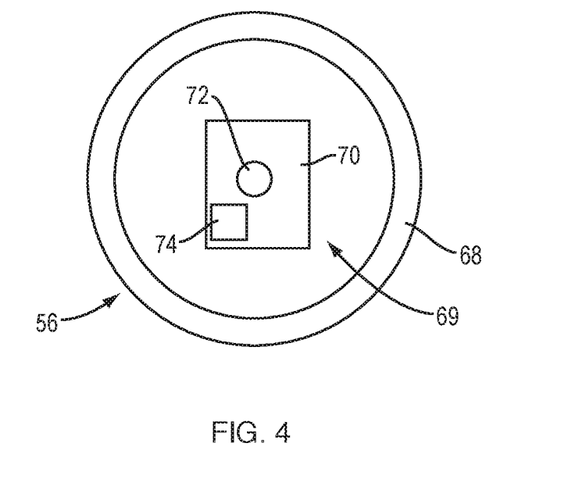
FIG. 4 is a plan view of a VCSEL diode 56 of the support assembly of FIG. 1.
Figure 5:
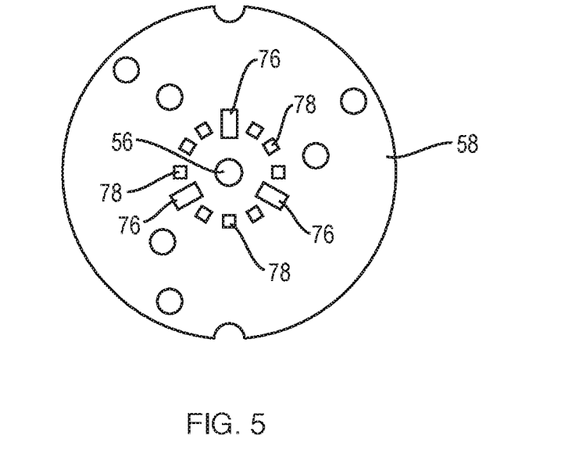
FIG. 5 is a plan view of printed circuit board of support assembly of FIG. 1.

As shown in FIGS. 4-5, PCB 58 is positioned adjacent to (e.g. operatively coupled to) VCSEL diode 56 with laser subassembly 69 that comprises VCSEL laser 72. When assembling laser assembly 10, PCB 58 can be rotated to compensate for any difference in polarity associated with VCSEL laser 72, and once it is aligned properly and pointed in the proper direction, adhesive elements 20 can be cured. Alignment and pointing of VCSEL laser 72 can affect the wavelength accuracy of the measured spectra. If the alignment and pointing is off target, accuracy tests will fail and/or a wrong answer will be provided. It can also contribute to a decrease in spectral resolution performance of the FTIR spectrometer.

It is to be appreciated that VCSEL laser 72 has a temperature coefficient of approximately 0.06 nm/K. As noted above, temperature change can produce wavelength shifts, which can result in the measured IR spectrum being out of the specified wavelength accuracy. In certain embodiments, operation of VCSEL laser 72 may be shut down if its surrounding temperature gets too high. For example, VCSEL laser 72 may be shut down if its surrounding temperature rises above 62° C.

Adhesive elements 20 may be cured with a UV cure wand, for example. In certain embodiments, three of the six adhesive elements 20 that are equally spaced from one another may be cured first, followed by the other three equally spaced adhesive elements 20.

As described above, PCB 58 is positioned adjacent to VCSEL diode 56 that may include housing 68, such as a TO-46 can, within which laser subassembly 69 may be positioned. Laser subassembly 69 may include a thermoelectric cooler (TEC) 70 seated within housing 68 and VCSEL laser 72 mounted on TEC 70. Laser subassembly 69 may also include thermistor 74 mounted on TEC 70, which provides feedback to a temperature controller (not shown) that regulates cooling of the TEC 70.

An inner surface of PCB 58 is shown in FIG. 5. In this embodiment VCSEL diode 56 is mounted in a center of PCB 58, and is surrounded by a plurality of thermistors 76 interspersed between a plurality of heating elements 78. In certain embodiments, heating elements 78 may be resistors. In certain embodiments, three thermistors 76 are spaced equally at 120 degree intervals around VCSEL diode 56, with a plurality of heating elements 78 positioned between each set of adjacent thermistors 76. In certain embodiments, three heating elements 78 are positioned between each set of adjacent thermistors 76.

Thermistors 76 provide temperature readings to a temperature controller (not shown), which calculates an average temperature and then regulates operation of heating elements 78 to produce a desired temperature.

The temperature of VCSEL laser 72 can therefore be accurately controlled through the combination of cooling from TEC 70 and heating from heating elements 78 on PCB 58. At a macro level, heating elements 78 serve to provide heat to warm VCSEL laser 72, and thermal assembly 28 helps to retain the heat in an area around VCSEL laser 72. Specifically, heat from heating elements 78 heats thermal mass 42 in order to provide heat to the area around VCSEL laser 72, and this area is insulated by thermal insulator 30, which slows heat transfer away from VCSEL laser 72.

Cooling is then applied as needed by way of TEC 70 to obtain a more precise temperature control for VCSEL laser 72. Maintaining a precise temperature of VCSEL laser 72 will minimize adverse changes to the desired wavelength of the light produced by VCSEL laser 72.

In certain embodiments, heating elements 78, thermal assembly 28, and TEC 70 cooperate to maintain VCSEL laser 72 at a temperature of approximately 40° C.+/−70 millikelvin or better.

Heat is provided by heating elements 78 such that the temperature of PCB 58 is approximately 10-20° C. above the air temperature. The cooling provided by TEC 70 is then used to fine tune the temperature, and is considered to be the controlled variable.

Figure 6:
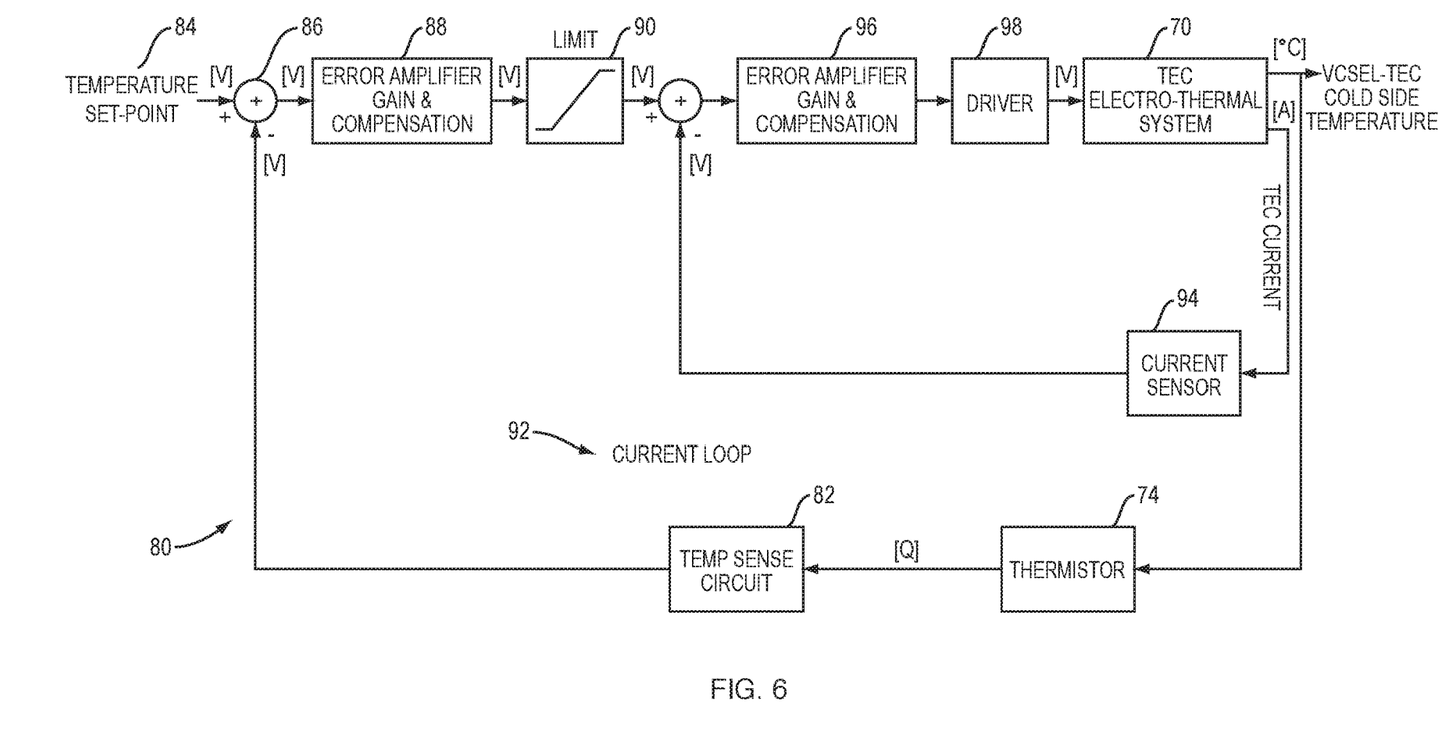
FIG. 6 is a schematic view of a cooling temperature control assembly used with the support assembly of FIG. 1.

A cooling temperature control assembly 80 is shown in FIG. 6, where the temperature of TEC 70 is continuously monitored by thermistor 74, by means of a temperature sensing circuit 82. The temperature is now represented by a voltage which is compared to a setpoint 84 at a summing junction 86. The difference between the setpoint and the measured temperature (represented by a voltage) is referred to as the "error" voltage. A high-gain amplifier 88 amplifies the error and passes the resulting voltage to the input of the current loop through a limiter 90. Limiter 90 serves the purpose of setting a voltage limit at the input of a current loop 92. Since current loop 92 produces a current proportional to the input voltage, limiter 90 effectively caps the maximum current that can be produced by current loop 92. This is a useful function since it prevents overloading of TEC 70, and avoids creating an "inversion" in the control loop that happens when TEC 70 is driven with such high a current that it produces more heat than it can remove, resulting in a runaway situation.

Current loop 92 operates in a manner similar to the temperature (outer) loop. The current through TEC 70 is continuously monitored, and represented by a voltage generated by a current sensor 94. The sensed current is compared to the command voltage coming from the temperature loop's error amplifier 88 via limiter 90, and an error voltage is produced. The error voltage is passed to a high-gain amplifier 96 and then to a driver 98 capable of producing the 500mA maximum current that TEC 70 can accept.

Because the VCSEL laser 72 is spaced from thermistor 74, the accuracy of the temperature control loop is somewhat reduced. The use of thermal assembly 28 to provide a controlled and constant above ambient temperature around VCSEL laser can compensate for this problem.

Figure 7:
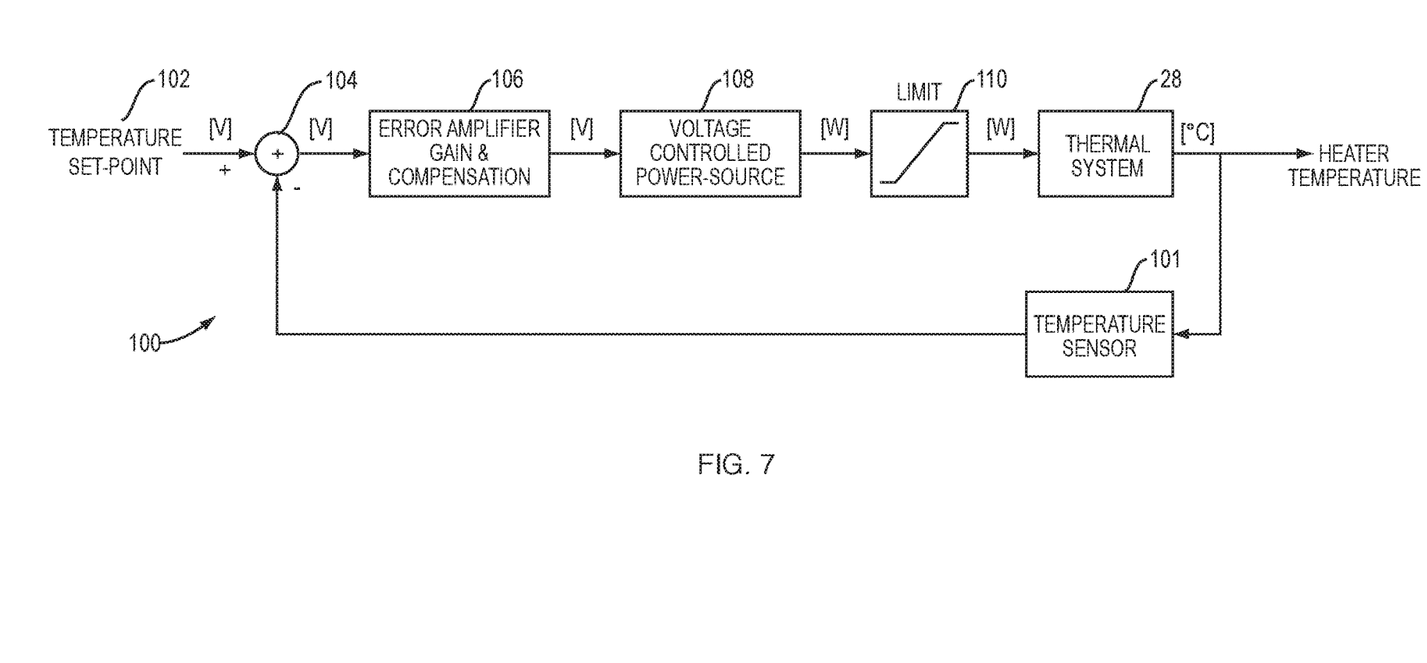
FIG. 7 a schematic view of a heating temperature control assembly used with the support assembly of FIG. 1.

A heating temperature control assembly 100 as shown in FIG. 7. Heating temperature control assembly 100 uses a feedback loop to control the temperature produced by heating elements 78, along with large forward gain and frequency compensation in a manner similar to that of cooling temperature control assembly 80.

A temperature sensor 101 formed of thermistors 76 measures the temperature and provides a spatial average of the temperature of PCB 58. The temperature is now represented by a voltage which is compared to a setpoint 102 at a summing junction 104. The difference between the setpoint and the measured temperature (represented by a voltage) is referred to as the "error" voltage. A high-gain amplifier 106 amplifies the error and passes the resulting voltage through a voltage controlled power source 108 and a limiter 110.

As noted above, VCSEL laser 72 is also sensitive to current variations and, therefore, requires a constant current in order to deliver a constant wavelength laser signal. Changes in the laser current can result in a change in intensity since the intensity is proportion to the current (Slope Efficiency), and a change in wavelength. It has been found that the wavelength change for VCSEL laser 72 may be specified to be approximately 8ppm/mA. Thus, a change in the laser current can cause a shift in the FTIR spectrum. The change in laser intensity may/may not be visible to the user as the instrument is designed with some margin. However, in the extreme case where the intensity is excessively high, the detector may become saturated and its gain drops, causing distortion. Ultimately clipping will occur and wavelength resolution is essentially lost. If the laser current is too low, it will cause the laser signal to be more poorly represented relative to the noise inherently present in the signal path. This, in turn, leads to increased noise-floor in the FTIR spectrum and therefore poorer overall SNR from the user's perspective.

Figure 8:
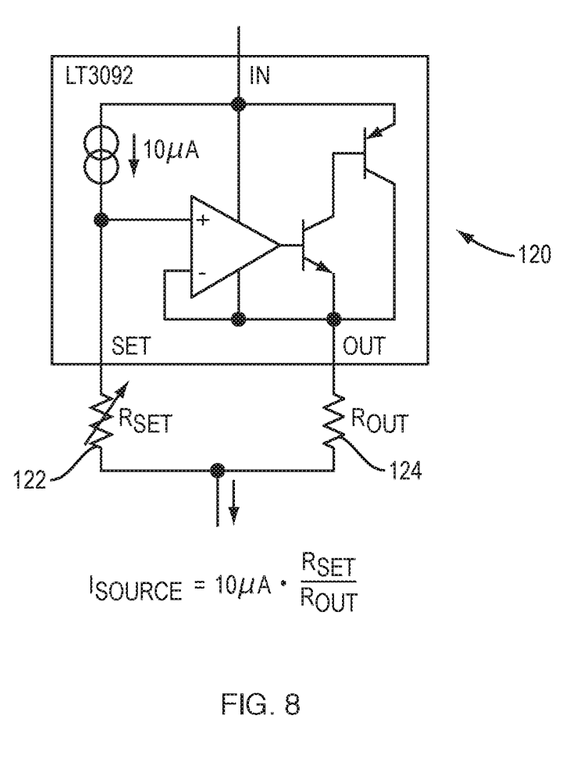
FIG. 8 is a schematic view a current circuit used with the support assembly of FIG. 1.

As shown in FIG. 8, an integrated circuit 120 uses a control loop based regulation scheme to control the current provided to VCSEL laser 72. Integrated circuit 120 has a precision current reference built in, which is used as a setpoint for the control loop. A local feedback loop is created with a setpoint resistor 122 and an output resistor 124.

In certain embodiments, setpoint resistor 122 may have a resistance of approximately 20.0 kΩ and output resistor 124 may have a resistance of approximately 100 kΩ, with approximately 0.1% tolerance and a temperature coefficient of 10 ppm. In certain embodiments, the current provided to VCSEL laser 72 is fixed at a value between approximately 1.976 mA and 2.024 mA.

The use of laser assembly 10 as described herein for supporting VCSEL laser 72 enables its use in a high performance FTIR spectrometer with a wavelength accuracy specification of ±0.02 $cm^{-1}$ and a spectral resolution of <0.25 $cm^{-1}$.

The wavelength accuracy of an FTIR instrument with VCSEL laser 72 can be tested by monitoring the CO peak of the IR spectrum over a period of time and temperature. The nominal CO peak location is 2176.284 $cm^{-1}$. The wavelength accuracy requirement, denoted as the LSL and USL, is ±0.02 $cm^{-1}$.

Figure 9:
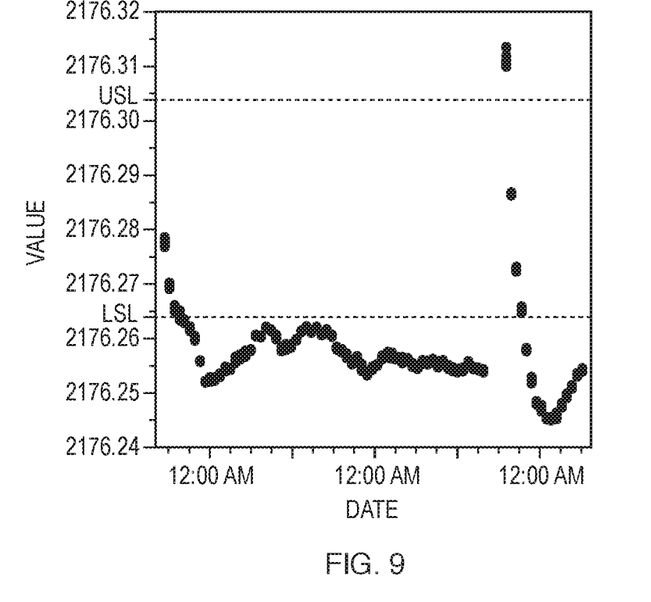
FIG. 9 is a graph showing an experiment using the support assembly of FIG. 1 with an FTIR instrument without a thermal assembly.

An FTIR instrument experiment was run using laser assembly 10 without thermal assembly 28, the results of which are seen in FIG. 9. As shown here, the test was run over a 24 hour period, where the ambient temperature varied by approximately 3° C. It can be seen that there is a significant variation in the CO peak location, resulting in the wavelength accuracy failing to meet requirements.

Figure 10:
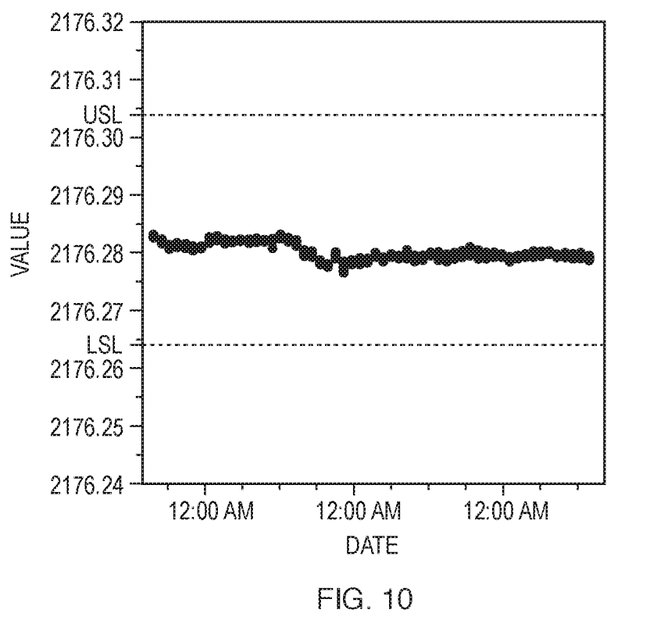
FIG. 10 is a graph showing an experiment using the support assembly of FIG. 1 with an FTIR instrument with a thermal assembly.

Another FTIR Instrument experiment was run using laser assembly 10 with thermal assembly 28, the results of which are seen in FIG. 10. In this experiment the instrument was tested in an environment chamber, the temperature of which was varied from 15° C. to 35° C. over the course of the 24 hour test. As can be seen here, there is no significant variation in the CO peak.

Those having skill in the art, with the knowledge gained from the present disclosure, will recognize that various changes can be made to the disclosed apparatuses and methods in attaining these and other advantages, without departing from the scope of the present disclosure. As such, it should be understood that the features described herein are susceptible to modification, alteration, changes, or substitution. For example, it is expressly intended that all combinations of those elements and/or steps which perform substantially the same function, in substantially the same way, to achieve the same results are within the scope of the embodiments described herein. Substitutions of elements from one described embodiment to another are also fully intended and contemplated. The specific embodiments illustrated and described herein are for illustrative purposes only, and not limiting of that which is set forth in the appended claims. Other embodiments will be evident to those of skill in the art. It should be understood that the foregoing description is provided for clarity only and is merely exemplary. The spirit and scope of the present disclosure is not limited to the above examples, but is encompassed by the following claims. All publications and patent applications cited above are incorporated by reference in their entirety for all purposes to the same extent as if each individual publication or patent application were specifically and individually indicated to be so incorporated by reference.

What is claimed is:

1. A laser mount assembly comprising:
    a lens holder including a collimating lens;
    a laser subassembly positioned adjacent the lens holder and comprising:
        a vertical-cavity surface-emitting laser,
        a thermal electric cooler, and
        a thermistor;
    a printed circuit board positioned adjacent the laser subassembly and including a plurality of heating components; and
    a thermal assembly positioned adjacent the lens holder and the laser subassembly and comprising:
        a thermal insulator,
        a thermal mass positioned adjacent the thermal insulator, and
        a thermal heat transfer pad positioned adjacent the thermal mass;
    wherein the heating components heat the area between the lens holder and the laser subassembly.

2. The laser mount assembly of claim 1, wherein the thermal mass is formed of aluminum.

3. The laser mount assembly of claim 1, wherein the thermal mass, the thermal heat transfer pad and the laser subassembly are all contained within the thermal insulator adjacent the printed circuit board.

4. The laser mount assembly of claim 1, further comprising a heat sink positioned adjacent the thermal assembly.

5. The laser mount assembly of claim 4, further comprising a cover positioned adjacent the heat sink.

6. The laser mount assembly of claim 5, wherein the cover is formed of plastic.

7. The laser mount assembly of claim 5, wherein the cover includes a plurality of apertures.

8. The laser mount assembly of claim 7, wherein the apertures are in the form of slots.

9. The laser mount assembly of claim 1, wherein the printed circuit board includes a plurality of thermistors.

10. The laser mount assembly of claim 1, wherein the printed circuit board is circular.

11. The laser mount assembly of claim 1, wherein the heating components are resistors.

12. The laser mount assembly of claim 1, wherein the printed circuit board includes a current source for the vertical-cavity surface-emitting laser.

13. The laser mount assembly of claim 12, wherein the printed circuit board includes a current sensor.

14. The laser mount assembly of claim 1, further comprising a laser assembly base positioned adjacent the lens holder.

15. The laser mount assembly of claim 14, further comprising a plurality of adhesive elements securing the lens holder to the laser assembly base.

16. The laser mount assembly of claim 15, wherein the laser assembly base and the lens holder include undercuts that cooperate to define a keystone slot, the adhesive elements being positioned within the keystone slot.

17. The laser mount assembly of claim 15, wherein six adhesive elements secure the lens holder to the laser assembly base.

18. The laser mount assembly of claim 15, wherein the adhesive is an acrylated urethane.

19. A method of heating a laser mount assembly comprising:
    providing a laser mount assembly comprising:
        a lens holder including a collimating lens;
        a laser subassembly positioned adjacent the lens holder and comprising:
            a vertical-cavity surface-emitting laser,
            a thermal electric cooler, and a thermistor;
a printed circuit board positioned adjacent the laser subassembly and including a plurality of heating components; and
a thermal assembly positioned adjacent the lens holder and the laser subassembly and comprising:
a thermal insulator,
a thermal mass positioned adjacent the thermal insulator, and
a thermal heat transfer pad positioned adjacent the thermal mass;
heating the area between the lens holder and the laser subassembly to above a setpoint for the thermal electric cooler; and
cooling the vertical-cavity surface-emitting laser to the desired setpoint using the thermal electric cooler and the thermistor.

20. The method of claim 19, wherein the setpoint temperature is 40° C.+/−70 millikelvin.

* * * * *